United States Patent
Carothers et al.

(10) Patent No.: US 9,305,779 B2
(45) Date of Patent: Apr. 5, 2016

(54) METHOD FOR GROWING GERMANIUM EPITAXIAL FILMS

(75) Inventors: Daniel N. Carothers, Oro Valley, AZ (US); Craig M. Hill, Warrenton, VA (US); Andrew T. S. Pomerene, Leesburg, VA (US); Vu A. Vu, Falls Church, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1961 days.

(21) Appl. No.: 12/539,003

(22) Filed: Aug. 11, 2009

(65) Prior Publication Data

US 2011/0036289 A1 Feb. 17, 2011

(51) Int. Cl.
- C30B 23/00 (2006.01)
- C30B 25/00 (2006.01)
- C30B 28/12 (2006.01)
- C30B 28/14 (2006.01)
- H01L 21/02 (2006.01)

(52) U.S. Cl.
CPC ........ H01L 21/0262 (2013.01); H01L 21/0245 (2013.01); H01L 21/02381 (2013.01); H01L 21/02502 (2013.01); H01L 21/02532 (2013.01); H01L 21/02579 (2013.01); H01L 21/02658 (2013.01)

(58) Field of Classification Search
USPC .......................................... 117/94, 84, 88, 89
See application file for complete search history.

(56) References Cited

U.S. PATENT DOCUMENTS

| | | | |
|---|---|---|---|
| 4,420,258 | A | 12/1983 | Burns et al. |
| 4,507,157 | A | 3/1985 | Oliver |
| 4,547,072 | A | 10/1985 | Yoshida et al. |
| 4,748,617 | A | 5/1988 | Drewlo |
| 4,921,354 | A | 5/1990 | SooHoo |
| 5,165,001 | A | 11/1992 | Takagi et al. |
| 5,281,805 | A | 1/1994 | Sauer |
| 5,371,591 | A | 12/1994 | Martin et al. |

(Continued)

FOREIGN PATENT DOCUMENTS

| | | |
|---|---|---|
| EP | 0 818 693 | 1/1998 |
| EP | 1 067 409 | 1/2001 |

(Continued)

OTHER PUBLICATIONS

WIPO, International Search Report dated Sep. 17, 2010, International App. No. PCT/US10/44185.

(Continued)

*Primary Examiner* — James McDonough
(74) *Attorney, Agent, or Firm* — Daniel J. Long; Russell Ng PLLC; Antony Ng

(57) ABSTRACT

A method for growing germanium epitaxial films is disclosed. Initially, a silicon substrate is preconditioned with hydrogen gas. The temperature of the preconditioned silicon substrate is then decreased, and germane gas is flowed over the preconditioned silicon substrate to form an intrinsic germanium seed layer. Next, a mixture of germane and phosphine gases can be flowed over the intrinsic germanium seed layer to produce an n-doped germanium seed layer. Otherwise, a mixture of diborane and germane gases can be flowed over the intrinsic germanium seed layer to produce a p-doped germanium seed layer. At this point, a bulk germanium layer can be grown on top of the doped germanium seed layer.

10 Claims, 2 Drawing Sheets

(56) References Cited

U.S. PATENT DOCUMENTS

| | | | |
|---|---|---|---|
| 5,430,755 | A | 7/1995 | Perlmutter |
| 5,625,636 | A | 4/1997 | Bryan et al. |
| 5,674,778 | A | 10/1997 | Lee et al. |
| 5,703,989 | A | 12/1997 | Khan et al. |
| 5,736,461 | A | 4/1998 | Berti et al. |
| 5,828,476 | A | 10/1998 | Bonebright et al. |
| 5,834,800 | A | 11/1998 | Jalali-Farahani et al. |
| 6,117,771 | A | 9/2000 | Murphy et al. |
| 6,242,324 | B1 | 6/2001 | Kub et al. |
| 6,331,445 | B1 | 12/2001 | Janz et al. |
| 6,387,720 | B1 | 5/2002 | Misheloff et al. |
| 6,400,996 | B1 | 6/2002 | Hoffberg et al. |
| 6,477,285 | B1 | 11/2002 | Shanley |
| 6,605,809 | B1 | 8/2003 | Engels et al. |
| 6,677,655 | B2 | 1/2004 | Fitzergald |
| 6,680,495 | B2 | 1/2004 | Fitzergald |
| 6,738,546 | B2 | 5/2004 | Deliwala |
| 6,785,447 | B2 | 8/2004 | Yoshimura et al. |
| 6,795,622 | B2 | 9/2004 | Forrest et al. |
| 6,850,252 | B1 | 2/2005 | Hoffberg |
| 6,861,369 | B2 | 3/2005 | Park |
| 6,936,839 | B2 | 8/2005 | Taylor |
| 6,968,110 | B2 | 11/2005 | Patel et al. |
| 7,006,881 | B1 | 2/2006 | Hoffberg et al. |
| 7,010,208 | B1 | 3/2006 | Gunn, III et al. |
| 7,043,106 | B2 | 5/2006 | West et al. |
| 7,072,556 | B1 | 7/2006 | Gunn, III et al. |
| 7,082,247 | B1 | 7/2006 | Gunn, III et al. |
| 7,103,252 | B2 | 9/2006 | Ide |
| 7,139,448 | B2 | 11/2006 | Jain et al. |
| 7,215,845 | B1 | 5/2007 | Chan et al. |
| 7,218,809 | B2 | 5/2007 | Zhou et al. |
| 7,218,826 | B1 | 5/2007 | Gunn, III et al. |
| 7,259,031 | B1 | 8/2007 | Dickson et al. |
| 7,272,279 | B2 | 9/2007 | Ishikawa et al. |
| 7,315,679 | B2 | 1/2008 | Hochberg et al. |
| 7,329,593 | B2 * | 2/2008 | Bauer .................. C30B 25/10 117/89 |
| 7,333,679 | B2 | 2/2008 | Takahashi |
| 7,348,230 | B2 | 3/2008 | Matsuo et al. |
| 7,356,221 | B2 | 4/2008 | Chu et al. |
| 2003/0026546 | A1 | 2/2003 | Deliwala |
| 2003/0183825 | A1 | 10/2003 | Morse |
| 2004/0007724 | A1 * | 1/2004 | Murthy ............. H01L 29/41733 257/288 |
| 2004/0146431 | A1 | 7/2004 | Scherer et al. |
| 2004/0190274 | A1 | 9/2004 | Saito et al. |
| 2005/0094938 | A1 | 5/2005 | Ghiron et al. |
| 2006/0105509 | A1 | 5/2006 | Zia et al. |
| 2006/0158723 | A1 | 7/2006 | Voigt et al. |
| 2006/0238866 | A1 | 10/2006 | Von Lerber |
| 2006/0240667 | A1 | 10/2006 | Matsuda et al. |
| 2007/0042570 | A1 | 2/2007 | Dip et al. |
| 2007/0116398 | A1 | 5/2007 | Pan et al. |
| 2007/0202254 | A1 | 8/2007 | Ganguli et al. |
| 2008/0159751 | A1 | 7/2008 | Matsui et al. |
| 2008/0240180 | A1 | 10/2008 | Matsui et al. |

FOREIGN PATENT DOCUMENTS

| | | |
|---|---|---|
| WO | 9314514 | 7/1993 |
| WO | 0127669 | 4/2001 |
| WO | 0216986 | 2/2002 |
| WO | 2004088724 | 10/2004 |
| WO | 2007149055 | 12/2007 |

OTHER PUBLICATIONS

Pruessner et al., "InP-Based Optical Waveguide MEMS Switches with Evanescent Coupling Mechanism", Journal of Microelectromechanical Systems, vol. 14, No. 5, Oct. 2005.

May et al., "Integrated Process for Silicon Nitride Waveguide Fabrication", IBM Technical Disclosure Bulletin, vol. 33, No. 2, Jul. 1990.

Matsushita et al., "Narrow CoSi2 Line Formation on SiO2 by Focused Ion Beam", IEEE Xplore 1999.

"Process Integration", Cobalt Self-aligned Silicide Process, Chapter 13.

Liu et al., "Design of Monolithically Integrated GeSi Electro-absorption Modulators and Photodetectors on an SOI Plaform", Optics Express 623, vol. 15, No. 2, Jan. 22, 2007.

Fijol et al., "Fabrication of Silicon-on-insulator Adiabatic Tapers for Low Loss Optical Interconnection of Photonic Devices".

Yap et al., "Integrated Opteoelectronic Circuits with InP-based HBTs", Proceedings of SPIE, vol. 4290, 2001.

Roth, "Electroabsorption Modulators for CMOS Compatible Optical Interconnects in III-V and Group IV Materials", Aug. 2007, (part 1 of 3).

Roth, "Electroabsorption Modulators for CMOS Compatible Optical Interconnects in III-V and Group IV Materials", Aug. 2007, (part 2 of 3).

Roth, "Electroabsorption Modulators for CMOS Compatible Optical Interconnects in III-V and Group IV Materials", Aug. 2007, (part 3 of 3).

Kimberling et al., "Electronic-photonic Integrated Circuits on the CMOS Platform".

Chao et al., "Analysis of Temperature Profiles of Thermo-optic Waveguides", Fiber and Integrated Optics, vol. 33.

Okyay et al., "Silicon Germanium CMOS Optoelectronic Switching Device: Bringing Light to Latch", IEEE Transactions on Electron Devices, vol. 54, No. 12, Dec. 2007.

McAulay et al., "All-optical Switching and Logic with an Integrated Optic Microring Resonator", Proc. of SPIE vol. 5814.

Kik et al, "Erbium Doped Optical Waveguide Amplifiers on Silicon", MRS Bulletin 23(4), 48, Apr. 1998.

Kimmet, J. S., "M.S. Thesis: Integrated Circuit Fabrication Details," Rutgers University, 1999; 18 pp.

* cited by examiner

METHOD FOR GROWING GERMANIUM EPITAXIAL FILMS

BACKGROUND OF THE INVENTION

1. Technical Field

The present invention relates to epitaxial films in general, and in particular to a method for growing germanium epitaxial films on silicon substrates.

2. Description of Related Art

There are two conventional methods for growing single-crystal germanium films on silicon substrates using ultra-high vacuum chemical vapor deposition (UHV-CVD). The first method allows a germanium film to be grown directly on top of a silicon layer, and the second method uses a silicon and silicon germanium buffer layer at the interface.

Since the first method is very selective, a germanium film only grows on a silicon layer and not on any exposed dielectric material. The problem with the first method is that the resultant germanium film is very rough and has a substantially high defect density. Compared with the first method, the second method is not selective at all. Thus, although the second method overcomes the roughness problem, the resultant germanium film occurs on an underlying silicon layer as well as an underlying dielectric layer. The growth on the underlying silicon layer is desired but the growth on the underlying dielectric layer is not.

The present disclosure provides an improved method for growing selective germanium epitaxial films.

SUMMARY OF THE INVENTION

In accordance with a preferred embodiment of the present invention, a silicon substrate is initially preconditioned with hydrogen gas. The temperature of the preconditioned silicon substrate is then decreased, and germane gas is flowed over the preconditioned silicon substrate to form an intrinsic germanium seed layer. Next, a mixture of germane and phosphine gases can be flowed over the intrinsic germanium seed layer to produce an n-doped germanium seed layer. Otherwise, a mixture of diborane and germane gases can be flowed over the intrinsic germanium seed layer to produce a p-doped germanium seed layer. At this point, a bulk germanium layer can be grown on top of the doped germanium seed layer.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The desired smooth and highly selective germanium layer is formed using a UHV-CVD system. The formation can be completed by using the following gases: hydrogen, 100% silane ($SiH_4$), 100% germane ($GeH_4$), 1% diborane ($B_2H_6$) and 1% phosphine ($PH_3$).

Figure 1:
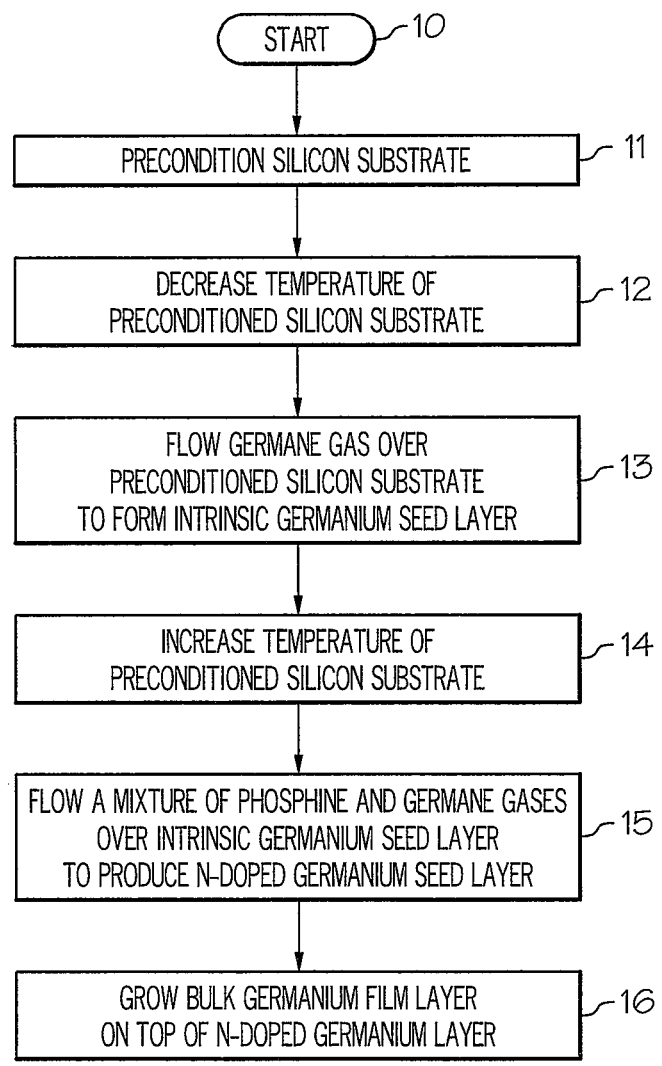
FIG. 1 is a high-level process flow diagram of a method for growing germanium epitaxial films, in accordance with a preferred embodiment of the present invention.

Referring now to the drawings and in particular to FIG. 1, there is illustrated a high-level process flow diagram of a method for growing germanium epitaxial films, in accordance with a preferred embodiment of the present invention. Starting at block 10, a silicon substrate is preconditioned with hydrogen gas at 750° C. for 60 minutes, as shown in block 11. The pressure of hydrogen is controlled at $3E^{-4}$ mBar.

Next, the temperature is ramped down from 750° C. to 350° C. in 200 minutes in vacuum at 2° C. per minute, as depicted in block 12.

Germane gas at $1.5E^{-3}$ mBar is flowed over the preconditioned silicon substrate for 120 minutes, as shown in block 13. This step initiates the layer-by-layer growth for approximately the first ten layers of defect-free single-crystal germanium—an intrinsic germanium seed layer.

The temperature is then ramped back up from 350° C. to 600° C. in 125 minutes in vacuum at 2° C. per minute, as depicted in block 14.

A 1:3 mixture of phosphine and germane gases at $6E^{-4}$ mBar is flowed over the intrinsic germanium seed layer for 30 minutes, as shown in block 15. This in-situ doped germanium growth step produces approximately 150 Å of an n-doped germanium seed layer with a phosphorus concentration of $1E^{21}$ atoms/$cm^3$. Some of the phosphorus diffuses into the underlying intrinsic germanium seed layer (from block 13) and reduces the stress in the underlying intrinsic germanium seed layer. The stress in the germanium is initially created by the lattice mismatch between germanium and silicon from the intrinsic germanium seed layer and silicon substrate, respectively.

At this point, an uniform bulk single-crystal germanium film having an extremely low level of defects can be grown on top of the n-doped germanium seed layer, as depicted in block 16. For example, germane gas at $1.5E^{-3}$ mBar can be flowed over the the n-doped germinanium seed layer for 480 minutes to produce approximately 1 µm of an intrinsic germanium layer. If desired, the bulk germanium layer may be in-situ n-doped or p-doped by injecting some phoshine or diborane, respectively, along with the germane gas.

If a p-doped germanium seed layer is desired in block 15, the phosphine gas can be replaced by diborane gas with slightly different conditions. For example, a 1:1 mixture of diborane and germane gases at $6E^{-4}$ mBar is flowed over the intrinsic germanium seed layer for 30 minutes in order to produce a p-doped germanium seed layer. This in-situ doped germanium growth step produces approximately 150 Å of a p-doped layer with a boron concentration of $5E^{21}$ atoms/$cm^3$.

The steps shown in blocks 13 and 15 provide an intrinsic (first) germanium seed layer and a doped (second) germanium seed layer, respectively, which are key to the growth of a smooth bulk germanium film layer. The mechanism behind the steps shown in blocks 13 and 15 is that some of the phosphorus diffuses into the underlying germanium and reduces the stress in the underlying germanium. The stress is generated by the lattice mismatch between germanium and silicon. The reduction of stresses results in a smooth bulk germanium growth.

The smooth defect-free germanium film can be used to produce germanium photodetectors with lower dark currents than can be produced with a typical process that does not use the doped step in block 15. The disclosed method also decreases the sensitivity of germanium growth to mask size. With a typical germanium growth, the final germanium thickness varies with the size of the mask opening to the silicon substrate. The overall germanium smoothness, decreased sensitivity to pattern size, and lower dark current make the disclosed method preferred for overall process integration.

Figure 2:
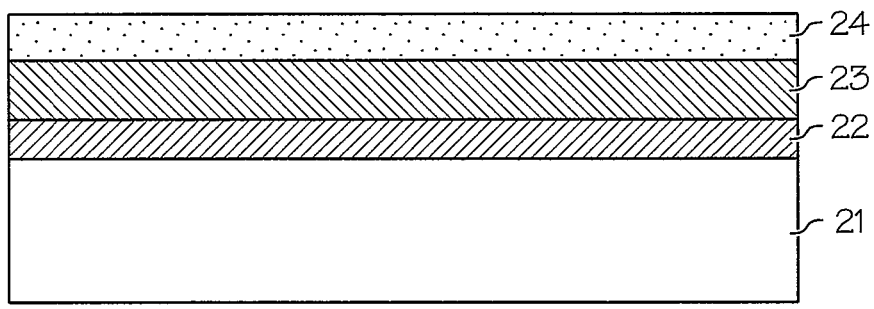
FIG. 2 depicts a silicon substrate having a germanium epitaxial film, in accordance with a preferred embodiment of the present invention.

With reference to FIG. 2, there is depicted a silicon substrate having a germanium epitaxial film, in accordance with a preferred embodiment of the present invention. As shown, an intrinsic germanium seed layer 22 is grown on top of a silicon substrate 21. A bulk germanium film 24, which can be intrinsic or doped, is grown on top of a doped germanium seed layer that rests on top of intrinsic germanium seed layer 22.

One conventional method for improving overall germanium smoothness and for decreasing germanium growth sensitivity to mask size is to use a silicon-germanium buffer layer. The usage of a silicon buffer layer, however, is not selective and results in germanium growth over exposed nitride and oxide regions as well as over exposed silicon regions. Frequently, nitride or oxide layers are used to mask regions where no germanium growth is desired, and a loss of growth selectivity requires additional processing to remove germanium from the tops of exposed nitride or oxide regions. The method of the present invention does not use any silicon containing buffer layer and therefore provides a very selective germanium growth. The simultaneous smooth germanium growth, low sensitivity to pattern size, and high growth selectivity are key benefits from the steps shown in blocks 12 and 13.

As has been described, the present invention provides an improved method for growing germanium epitaxial films. The method of the present invention can be used to grow single-crystal germanium films that are very selective and yet very smooth and defect-free. The improved germanium growth process allows for simpler processing and yields lower dark currents in germanium P-i-N photodiodes.

While the invention has been particularly shown and described with reference to a preferred embodiment, it will be understood by those skilled in the art that various changes in form and detail may be made therein without departing from the spirit and scope of the invention.

What is claimed is:

1. A method for growing germanium epitaxial films, said method comprising:
    flowing germane gas over a silicon substrate at a first temperature to form an intrinsic germanium seed layer on said silicon substrate;
    increasing said first temperature of said silicon substrate to a second temperature;
    flowing a mixture of diborane gas and germane gas over said intrinsic germanium seed layer to produce a doped germanium seed layer; and
    growing a bulk germanium film layer on top of said doped germanium layer.

2. The method of claim 1, wherein said first temperature is approximately 350° C.

3. The method of claim 1, wherein said flowing germane gas further includes flowing germane gas at approximately $1.5E^{-3}$ mBar.

4. The method of claim 1, wherein said second temperature is approximately 600° C.

5. A method for growing germanium epitaxial films, said method comprising:
    flowing germane gas over a silicon substrate at a first temperature to form an intrinsic germanium seed layer on said silicon substrate;
    increasing said first temperature of said silicon substrate to a second temperature;
    flowing a mixture of dopant gas and germane gas over said intrinsic germanium seed layer to produce a doped germanium seed layer, wherein said dopant gas contains phosphine; and
    growing a bulk germanium film layer on top of said doped germanium layer.

6. The method of claim 1, wherein said mixture of gases is flowed over said intrinsic germanium seed layer at approximately $6E^{-4}$ mBar.

7. The method of claim 1, wherein said bulk germanium film layer is intrinsic germanium film.

8. The method of claim 1, wherein said bulk germanium film layer is doped germanium film.

9. The method of claim 1, wherein said flowing a mixture of said gases further includes flowing said mixture of said gases while increasing temperature from said first temperature to said second temperature.

10. A method for growing germanium epitaxial films, said method comprising:
    flowing germane gas over a silicon substrate at a first temperature to form an intrinsic germanium seed layer on said silicon substrate;
    increasing said first temperature of said silicon substrate to a second temperature;
    flowing a mixture of dopant gas and germane gas over said intrinsic germanium seed layer to produce a doped germanium seed layer, wherein said flowing a mixture of said gases further includes flowing a mixture of said gases over said intrinsic germanium seed layer to produce said doped germanium seed layer capable of reducing crystalline defects in said intrinsic germanium seed layer via lattice mismatch reduction; and
    growing a bulk germanium film layer on top of said doped germanium layer.

* * * * *